United States Patent
Maier

(10) Patent No.: US 7,561,611 B2
(45) Date of Patent: Jul. 14, 2009

(54) EXTENDED-LIFETIME ELEMENTS FOR EXCIMER LASERS

(75) Inventor: Robert L. Maier, Ontario, NY (US)

(73) Assignee: Corning Incorporated, Corning, NY (US)

(*) Notice: Subject to any disclaimer, the term of this patent is extended or adjusted under 35 U.S.C. 154(b) by 453 days.

(21) Appl. No.: 11/050,986

(22) Filed: Feb. 3, 2005

(65) Prior Publication Data
US 2006/0171438 A1 Aug. 3, 2006

(51) Int. Cl.
H01S 3/223 (2006.01)
H01S 3/08 (2006.01)
H01S 3/00 (2006.01)
F21V 9/04 (2006.01)
F21V 9/06 (2006.01)
G02B 5/08 (2006.01)
G02B 5/20 (2006.01)

(52) U.S. Cl. ............... 372/57; 372/92; 372/98; 372/99; 372/102; 372/107; 372/109; 359/359; 359/360; 359/586; 359/587

(58) Field of Classification Search ............ 372/57, 372/92, 98, 99, 10, 107, 109; 359/359, 360, 359/586, 587
See application file for complete search history.

(56) References Cited

U.S. PATENT DOCUMENTS

| | | | | |
|---|---|---|---|---|
| 4,223,974 A | | 9/1980 | Masso | 350/1.7 |
| 5,027,101 A | * | 6/1991 | Morrill, Jr. | 337/297 |
| 5,080,465 A | | 1/1992 | Laude | 359/571 |
| 5,436,764 A | | 7/1995 | Umetani et al. | 359/566 |
| 5,493,393 A | | 2/1996 | Beranek et al. | 356/328 |
| 5,999,318 A | | 12/1999 | Morton et al. | 359/572 |
| 6,466,365 B1 | | 10/2002 | Maier et al. | 359/355 |
| 6,472,087 B1 | * | 10/2002 | Otani et al. | 428/696 |
| 6,511,703 B2 | | 1/2003 | Pan et al. | 427/166 |
| 6,529,321 B2 | | 3/2003 | Pan et al. | 359/360 |
| 6,833,949 B2 | | 12/2004 | Maier et al. | 359/355 |
| 2003/0021015 A1 | * | 1/2003 | Maier et al. | 359/350 |

FOREIGN PATENT DOCUMENTS

JP 63217311 A * 9/1988

OTHER PUBLICATIONS

"Silicon Monoxide Protected Front-Surface Mirrors", Hass, et al J. Opt. Soc. Am. vol. 39, pp. 179-184.
"Filmed Surfaces for Reflecting Optics", Haas, et al, J. Opt. Soc. Am. vol. 45, No. 11, pp. 945-952.

(Continued)

*Primary Examiner*—Kenneth A Parker
*Assistant Examiner*—Hrayr A Sayadian
(74) *Attorney, Agent, or Firm*—Walter M. Douglas

(57) ABSTRACT

The invention is directed to elements used in high power laser lithographic systems operating at below 250 nm, and in particular to elements that have a coating of selected materials to extend lifetime of the elements; and to a method of preparing the extended lifetime elements. The invention is particularly directed to gratings and mirrors that are coated with silicon dioxide, aluminum oxide or fluorinated silicon dioxide. The coatings of the invention attain their extended life as a result of being deposited while being simultaneously bombarded with an energetic ion plasma.

16 Claims, 2 Drawing Sheets

OTHER PUBLICATIONS

"Reflecting Coatings for the Extreme Ultraviolet", R. Tousey, et al, J. Opt. Soc. Am. vol. 49, No. 6, Jun. 1959 pp. 593-602.

"Reflectance and durability of Ag mirrors coated with thin layers of Al2O3 plus reactively deposited silicon oxide" G. Hass, et al, Applied Optics, Nov. 1975, vol. 14, No. 11.

"Preparation and Measurement of Reflecting Coatings for the Vacuum Ultraviolet", J. Madden, Phy of Thin Films.

"Silicon Monoxide Protected Front-Surface Mirrors", Hass, et al J. Opt. Soc. Am. vol. 39, pp. 179-184, (1949).

"Filmed Surfaces for Reflecting Optics", Haas, et al, J. Opt. Soc. Am. vol. 45, No. 11, pp. 945-952, (1955).

"Reflecting Coatings for the Extreme Ultraviolet", R. Tousey, et al, J. Opt. Soc. Am. vol. 49, No. 6, Jun. 1959 pp. 593-602.

"Reflectance and durability of Ag mirrors coated with thin layers of Al2O3 plus reactively deposited silicon oxide" G. Hass, et al, Applied Optics, Nov. 1975, vol. 14, No. 11.

"Preparation and Measurement of Reflecting Coatings for the Vacuum Ultraviolet", J. Madden, Phy of Thin Films, (1963).

\* cited by examiner

EXTENDED-LIFETIME ELEMENTS FOR EXCIMER LASERS

FIELD OF THE INVENTION

The invention is directed to elements used in excimer laser lithographic systems operation at wavelengths below 250 nm; and in particular to coated components, for example, gratings and mirrors used in such systems.

BACKGROUND OF THE INVENTION

Precision diffraction gratings have been manufactured since about 1882, and have been attributed to H. A. Rowland of Johns Hopkins University. A precision ruling engine is used to scribe very fine parallel lines in a glass or silica substrate. The methodology has been well understood for decades. There are advantages to using diffraction gratings in reflection applications, but for the case of low reflectivity substrate materials, such as silica, efficient gratings require a highly reflecting film to be vacuum deposited over the rulings. Aluminum is the preferred metal for vacuum deposition over the ruled substrate. Alternatively, aluminum can be vacuum deposited onto a glass or silica substrate. The rulings can then be cut directly into the aluminum film. However, freshly deposited aluminum films quickly form an oxide layer at the surface. The oxide layer is slightly absorbing for ultraviolet radiation, especially for wavelengths shorter than 200 nm. Hence, for ultraviolet application, a thin protective overcoat layer, typically of $MgF_2$, has been immediately deposited over the aluminum film as a means of preventing the aluminum from oxidation. The optimum layer thicknesses, the deposition techniques, and the process parameters for aluminum deposition, and for the protective overcoat depositions, are well known to those skilled in the art (see G. Hass, *J. Opt. Soc. Am.* Vol. 39 (1949), p. 179; R. Madden, *Physics of Thin Films*, Vol. 1. (Academic Press, New York 1963); and Canfield et al., Applied Optics, Vol. 14 (1975), pp. 2639-44). Techniques for depositing additional dielectric films to enhance the reflectance of aluminum are also well known and in common use (see J. Hass, ibid. and *J. Phys. Radium* Vol. 11 (1950), p. 394).

High power excimer lasers such as KrF, ArF, and $F_2$ lasers that operate at 248 nm, 193 nm and 157 nm, respectively, are light sources of choice for microlithographic applications. However, while output of such lasers is theoretically at a single wavelength, in fact the laser's output is not sufficiently monochromatic and must be spectrally reduced or "narrowed". Diffraction gratings, among other components, are key elements for narrowing the spectrum emitted by the laser. The grating achieves the narrowing by reflecting back into the laser's resonating cavity only a narrow range of wavelengths. Light energy at this narrow wavelength range resonates within the cavity and is emitted through a partially reflective mirror at the other end of the cavity. Typically, a master grating is first manufactured and then the master is replicated to form additional gratings. Each of the replicated gratings may then be used as a master grating to form additional replicas. The diffraction grating, be it a master grating or a replication of a master, must be highly reflective. High reflectivity is generally accomplished using an aluminum substrate and/or a high quality film deposition of aluminum onto a grating substrate.

The current state of the art of grating manufacture, including methods for obtaining enhanced reflectivity using thin film depositions, is described in U.S. Pat. No. 5,999,318 (the '318 patent), U.S. Pat. No. 6,511,703 (the "703 patent) and U.S. Pat. No. 6,529,321 the "321 patent). While the grating and methods for producing them described in the foregoing patents have proved useful to date, the industry has been increasing the average power delivered by excimer lasers. For example, the use of high power lasers with peak energy density (fluence) of >50 $mJ/cm^2$ with pulses lengths in the 10 nanosecond ("ns") range, pulse rates have increased by factors of 10 to 2 KHz and 4 KHz, and operating at wavelengths below 250 nm is becoming common. As a result of the use of such high power lasers, the lifetime of the laser elements (as measured by pulse count) such as mirrors and diffraction gratings has deteriorated. As a result, laser lithographic system operating time has been reduced.

Gratings are perhaps the most vulnerable components of the excimer laser system. Grating failures cause shutdowns of the lithography tool and replacement of the entire grating-containing module. Since lithography tools are very expensive, costing in the range of approximately $3MM to $10MM, the owners of such tools expect them to run twenty-fours a day, seven days a week. Unexpected and/or frequent shut downs for maintenance are very costly and disruptive to their production. While the replacement module containing the grating is expensive, the cost of the module is small in comparison to the cost of lost production resulting from failure of the tool. As a result, extended lifetimes for laser components such as diffraction gratings and mirrors are essential to both the microlithographic industry and to the manufacturers of the excimer laser systems used by the industry. Grating failure is generally caused by low reflectivity of the aluminum coating; which in turn is caused by oxide formation on the aluminum coating. In view of the system failures that can occur when gratings as presently known are used in high power excimer laser systems, and the high costs associated with such failures, there is a need for improved gratings with extended lifetime that can be used in such high power excimer lasers. The present invention presents a solution to this problem by providing improved gratings with extended lifetimes.

SUMMARY OF THE INVENTION

In one embodiment, the invention is directed to lithographic elements, for example, diffraction gratings and mirrors, having a high purity aluminum film or layer deposited on the element's surface in ultrahigh vacuum of approximately $10^{-6}$ mbar or better according to processes known to those skilled in the art. Subsequently, an extremely dense film or layer, or combination of films or layers, of dielectric material or materials is deposited on top of the aluminum layer. Examples of such dielectric materials include $Al_2O_3$, $SiO_2$, fluorinated silicon dioxide (herein $F-SiO_2$), and similar dielectric materials known to those skilled in the art.

In another embodiment, the invention is directed to extremely dense dielectric films that are deposited using an advanced plasma process in which the dielectric materials are deposited from an electron gun source while they are being simultaneously bombarded with an energetic ion plasma comprising an inert gas or mixture of inert gases admixed with oxygen.

In a further embodiment, the invention is directed to excimer laser elements coated with extremely dense films of dielectric materials.

In yet another embodiment, the invention is directed to a method of making laser lithography elements having an extended lifetime, the method having, among other steps, the steps of depositing an aluminum layer on a substrate surface and coating the layer with one or a plurality of layers of a dielectric material; the deposition of the dielectric material being carried out by depositing the dielectric material or materials from an electron gun source while simultaneously bombarding the materials being deposited with an energetic ion plasma comprising an inert gas or mixture of inert gases admixed with oxygen.

DETAILED DESCRIPTION OF THE INVENTION

Figure 1:
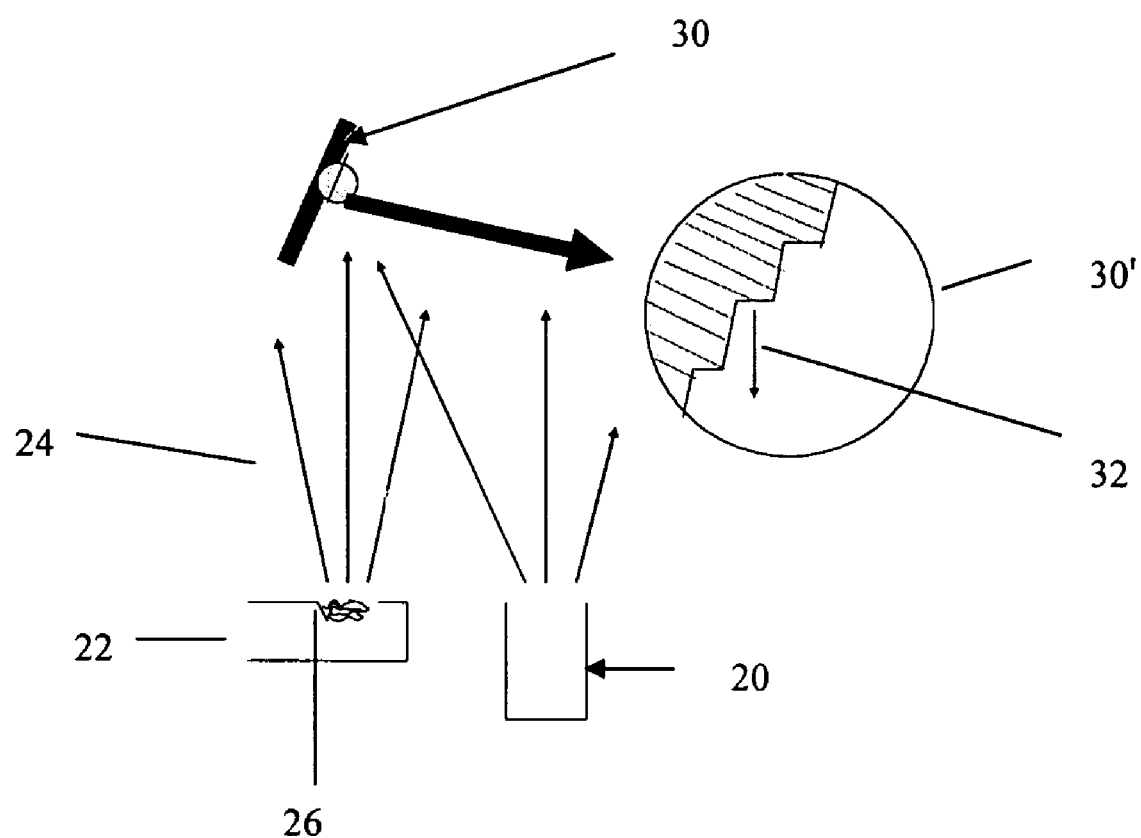
FIG. 1 illustrates the geometry of the deposition used in accordance with the invention.

While the art of making ruled diffraction gratings is known, the cost of making such ruled gratings (e.g., master gratings) are very expensive. As a result, techniques were developed to replicate master gratings; for example, as described in U.S. Pat. No. 5,999,318. In an attempt to increase efficiency, dielectric enhancements were proposed in both U.S. Pat. Nos. 6,529,321 and 6,511,703. In these patents, it was claimed that overcoatings of $MgF_2$, $SiO_2$, and $Al_2O_3$, as either single layers or as combinations of layers to enhance reflectivity, will protect the underlying aluminum film (layer) from oxidation, if the aluminum film was deposited in a vacuum of below $10^{-6}$ torr. According to the claims, such vacuum is required to avoid trapping oxygen in the deposition; oxygen that will eventually oxidize the aluminum. There was also some discussion about such depositions being "dense". These patents represent current technology prior to the present invention. While this technology may have worked in the past, it is failing when the powerful excimer lasers presently available, which operate at 1 KHz and higher and at 193 nm and shorter wavelengths, are used with the elements described in the foregoing patents.

According to the present inventors' research, protective overcoatings deposited according to foregoing '318, '321 and '703 are in fact quite porous. (The deposition of protective coatings is also described in U.S. Pat. No. 5,466,365 to Maier et al. and U.S. Pat. No. 6,833,949 to Maier et al. in which a coating of F—$SiO_2$ is deposited on optical lithography elements preferably made of calcium fluoride.) While film density could be improved by substrate heating to ~300° C., this is in fact not possible with replicated gratings owing to the differential expansion coefficients of the silica substrate, epoxy or other bonding materials, and the aluminum replicating layer. In addition, the out gassing properties of the bonding materials serve to contaminate the vacuum. In the research conducted by the inventors hereof, we have found the reflectivity of the aluminum film is indeed degraded by oxide formation. However, the source of that oxygen is not trapped within the deposition, but rather penetration of residual oxygen and/or water vapor through the rather porous overcoating layers as deposited according to the '318, '321, and '703 patents. These penetrations were unrecognized in the foregoing patents. We have found that even in a well-purged dry nitrogen environment, a few parts-per-million ("ppm") of oxygen and/or water vapor will penetrate through the porous overcoatings to the aluminum film. Further, oxide formation is initiated and promoted by high electric field strengths present in modern excimer sources (for example, KrF, ArF and $F_2$ excimer lasers) operating at pulse energies of ~5 mJ/cm$^2$ and higher, and for repetition rates of 1 KHz and higher. Under these circumstances, grating efficiency begins to degrade according to pulse count. That is, degradation increases as the pulse count increases. We have found that when protective overcoatings deposited according to the present invention are deposited on element surfaces, our processes for such coatings have provided extended lifetimes (pulse count) with minimal degradation to grating efficiency.

The starting point of the present invention is the replicated gratings as described in the '318, '321, and '703 patents. The master and replicated gratings can be made on any suitable substrate; for example, substrates of silicon, aluminum, silica (glass), and glass-ceramic and ceramic materials. The replicated surface is quite delicate and must not be physically touched. In addition, the replicated surface may be contaminated by residual release agents from the replication process. To avoid such contamination, and the resulting delamination of any coating that may occur may result from the presence of contaminants, a cleaning step such as ultraviolet ozone plasma may be performed immediately before loading a substrate into a vacuum chamber. In addition, a low voltage ion-plasma cleaning step may be performed within the vacuum chamber immediately before the deposition of the coating material. While these cleaning steps, which are familiar to those skilled, are desirable, we have found they are not necessary to achieving extended life coatings for replicated diffraction gratings, so long as the replicated grating substrate is delivered to the coating chamber uncontaminated from the replication process and from subsequent handling.

Figure 2:
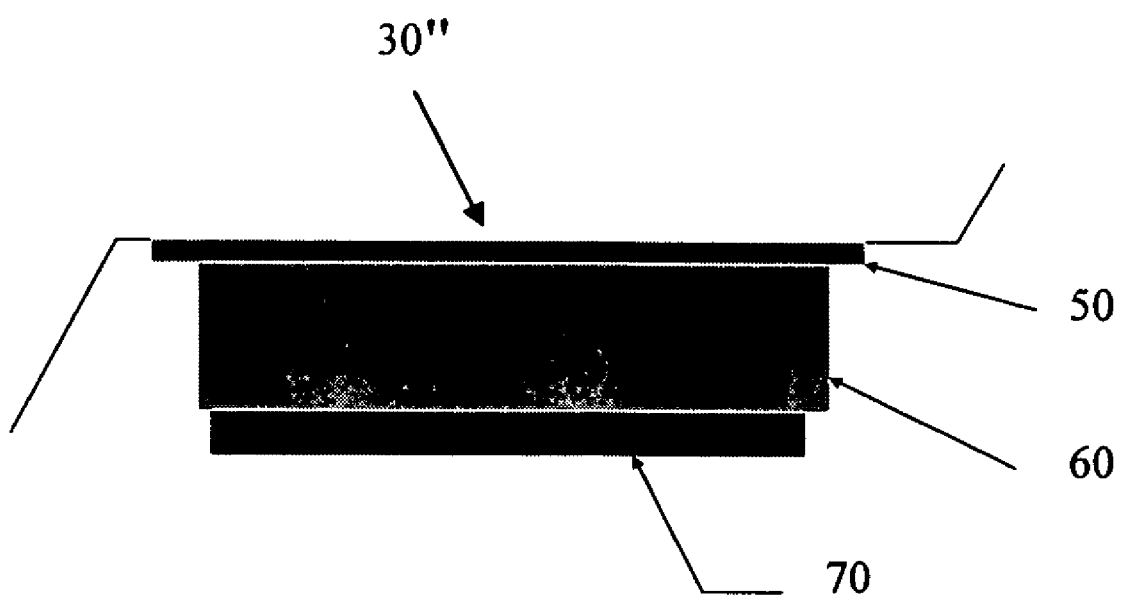
FIG. 2 is an expanded view of the blaze surface with a coating thereon.

In an example according to the invention, a replicated grating is mounted in the vacuum chamber such that the blazed face is approximately parallel to the chamber base plate and such that film deposition takes place at approximately normal incidence to the surface of interest as shown in FIGS. 1 and 2. In FIG. 1, which illustrates the deposition chamber geometry, a crucible 22 containing a coating precursor material 26 and a surface 30 that is to be coated are placed in a vacuum chamber (walls not shown) along with a plasma ion source 20. (An exploded view 30' of surface 30 illustrating the grating and the blaze direction given by arrow 32 is shown to the right of the broad black arrow). Evaporant 24 from crucible 20 is deposited on the surface 30 while the surface 30 and the deposited material is being continuously bombarded by an energetic ions generated by plasma source 20. FIG. 2 is an expanded view of substrate blaze surface 30" upon which has been placed an optional adhesion layer 50 that bonds to the substrate and the aluminum layer 60. The dielectric barrier layer 70 is shown on top of aluminum layer 60. For those cases where the film to be deposited is aluminum and where adhesion is, for example, aluminum to glass, a thin bonding layer of chrome, nickel, or an alloy of nickel and chrome would first be deposited on the glass (silica). In the case of replicated gratings where the deposition is not aluminum-to-glass, but rather aluminum-to-aluminum, the need for such bonding layers is unnecessary. Generally, the bonding layer can be a material selected from the group consisting of nickel, chrome, nickel-chrome alloy, and other metals and alloys known in the art to bond to aluminum and to glass, glass-ceramic substrates. The use of a metallic bonding layer is described in U.S. Pat. No. 4,223,974 to J. D. Masso.

In accordance with the invention no substrate heating is required; and once the replicated grating is mounted in the vacuum chamber, vacuum is applied to a level of at least $9 \times 10^{-6}$ mbar or better. When this level of vacuum is reached, the deposition process according to the invention can begin. Optionally, a low voltage ion plasma-cleaning step can be used at this point, although satisfactory results have been obtained without plasma cleaning. A film of high purity (99.999% or better) aluminum is deposited, using either electron gun or resistance sources, onto the unheated replication, under high vacuum ($9 \times 10^{-6}$ mbar or better) and at a fast deposition rate of more than 15 nm/sec. Preferably the electron gun deposition is at a rate of about 25 nm/sec. Since molten aluminum is chemically aggressive, excellent vacuum, as specified herein and fast deposition rates are necessary in order to minimize contamination from residual atmosphere within the chamber. The deposited film thickness is selected for optimum reflectance for these wavelengths (less than 200 nm). Typically the deposited film of aluminum, has a thickness in the range of 70-95 nm; preferably the thickness being approximately 85 nm.

In accordance with the invention, the deposited film, aluminum in the example given above, is protected from oxidation by deposition of a dielectric film. Dielectric films of silicon dioxide ($SiO_2$), aluminum oxide ($Al_2O_3$) and most particularly fluorinated silicon oxide (F—$SiO_2$) are deposited, at very near bulk density, from an electron gun source. This deposition takes place while simultaneously bombarding the depositing film with energetic ion plasma, created by a commercial ion source, and composed of an inert gas mixed with oxygen. The inert gas can be Ar, Xe, He, or Kr, or a mixture thereof, with Ar being the preferred inert gas. Momentum transfer from the energetic ions achieves dense deposition, while the energetic oxygen ions promote complete stoichiometry of the deposition. Single films for protection or combinations of films for both protection and enhancement of reflectivity can be used. The thickness and arrangement of layers is chosen to maximize reflectivity, and proceeds directly from thin film theory as explained in the references.

The dense depositions according to the invention are key to extended lifetimes for replicated gratings operating in modern high energy, high pulse rate excimer laser systems. The films according to the invention prevent residual oxygen, and/or water vapor existing in the purge gas, from penetrating the protective overcoatings and oxidizing the aluminum film.

The dielectric films are made from pure (99.9% or better) starting materials. In the case of fluorinated silica, the fluorine dopant levels are from 0.5 wt. % to 4.5 wt. %. Deposition rates at the substrate are between 0.05 nm/sec and 0.6 nm/sec; the preferred rate being 0.15±0.5 nm/sec. Chamber pressure during deposition ranges between $7 \times 10^{-5}$ mbar and $4 \times 10^{-4}$ mbar, but typically is approximately $2.5 \times 10^{-4}$ mbar. Such pressure is due to the inert gas plus oxygen, which must be bled into the ion source. Bombarding ions arrive at the depositing film with ion energies of between 80 ev to 150 ev, but typically approximately 10 ev. This is more than sufficient to overcome surface energies of ~5 ev for depositing molecules, and thus create compact dense films. In addition, the ratio of arriving molecules to arriving ions is important to film density and film stoichiometry. The exact details must be carefully worked out according to material being deposited, chamber geometry, deposition rates, gas flows, and other parameters selected for the ion source. These details will be understood by and within the ability of those skilled in the art when they use the teachings herein. The thickness of the deposited dielectric films is in the range of 20-150 nm; preferably in the range of 40 to 80 nm, depending somewhat on the wavelength of interest, and the phase change upon reflection at the aluminum-overcoating interface.

As an example of the method of the invention, a grating is fabricated by methods known in the art and replicated. The replicated grating is placed in the vacuum chamber as shown in FIG. 1. The chamber is evacuated to a pressure of $9 \times 10^{\wedge}-6$ mbar or better. No substrate heating is necessary. Using an electron gun, or resistance source for evaporation of the aluminum, the replicated grating is then coated with an aluminum film to a thickness in the range of 70-95 nm at an aluminum deposition rate in the range of 10-40 nm/sec, preferably at a rate in the range of 15-30 nm/sec, and most preferably at a deposition rate of 25 nm/sec±2 nm/sec. The electron gun is the preferred source for aluminum evaporation. After the aluminization, dielectric layer(s) are deposited, preferably in the same chamber without breaking vacuum. The pressure in the deposition chamber, which is as illustrated in FIG. 1 and described herein, rises to the range $7 \times 10^{-5}$ mbar to $4 \times 10^{-4}$ mbar as a natural consequence of warming the plasma source, and of the gasses which must be bled in for operation. Deposition is carried out preferably at a pressure of $2.5 \times 10^{-4}$ mbar±$1.0 \times 10^{-4}$ mbar. The preferred method for dielectric film evaporation is from electron gun melting, preferably at deposition rates of between 0.05 nm/sec and 0.6 nm/sec; the preferred rate being 0.15±0.5 nm/sec. To achieve dense deposition, that is, to achieve films which prevent oxygen and humidity penetration to the aluminum film, plasma bombardment during deposition of the dielectric films is necessary, and is the crux of the invention.

As illustrated in FIG. 1, the dielectric material 26 is evaporated from the crucible 26 by heating the material in the crucible by bombardment of a focused electron stream. Such evaporation methods are well understood in the art. Simultaneously with dielectric material deposition, the material being deposited on the aluminized surface is bombarded with an energetic ion plasma that is created by a plasma ion source. The energetic ions have an energy in the range of 80-150 eV, preferable being approximately 110 eV. The ions are a mixture of an inert gas and oxygen. The preferred inert gas is argon. The gases bled into the chamber are measured in standard cubic centimeters per minute of flow (SCCM). Bleed for the inert gas is in the range 5-15 SCCM, preferably 9±3 SCCM, while the oxygen bleed rate is in the range 2-14 SCCM, preferably 5±3 SCCM.

In order to prevent oxidation of the aluminum film by the ion plasma, in depositing the dielectric materials, the first layer deposition is initially carried out using an inert gas such as argon as the source for the bombarding ions. Once a 4-8 nm thickness of dielectric material has been deposited on the aluminum surface, oxygen is fed into the plasma source and the bombardment of the dielectric material is continued using a combination of argon ions (or other inert gas ions) and oxygen ions until the desired thickness of dielectric material has been deposited. The resulting lithographic element, for example, a grating or mirror, thus comprises a substrate for a mirror or a substrate having a grating etched thereon, a layer of aluminum over the substrate, a first layer of dielectric material that has been bombarded with inert gas ions only during deposition of the first 4-8 nm of it's total thickness. Subsequent layers of dielectric material that have been bombarded with a combination of inert gas ions and oxygen ions during deposition of their entire thickness may be added. The oxygen is not admitted until after the desired thickness of the first layer has been achieved in order to prevent the formation of a layer of aluminum oxide on the surface of the high reactive aluminum that has been deposited. As mentioned above, bombarding the dielectric layer during deposition serves to densify the layer the resulting deposited material approaches theoretical bulk density, Bombarding with a combination of inert gas and oxygen is used to the prevent the formation of oxygen voids in the deposited dielectric material structure.

Thus, according to the invention, when one or a plurality layers of a dielectric material is deposited on top of the aluminum layer, when the one dielectric layer is applied or when the first of a plurality of dielectric layers is applied, the one or the first dielectric layer is applied as a first and a second part, the first part being applied on top of the aluminum film and the second part being applied on top of the first part; and during deposition of the first part, the first part is subjected to bombardment by energetic inert gas ions; and during deposition of the second part, the second part is subjected to bombardment by a combination of energetic inert gas ions and energetic oxygen ions. The thickness of the first part of the dielectric layer is in the range of 4-8 nm, the thickness of the second part is in the range of 12-146 nm, and the total thickness of the dielectric layer is in the range of 20-150 nm. If more than one dielectric layer is being applied, the second, and subsequent (that is, third, fourth . . . ) layers can be applied as a single part accompanied by bombardment by a combination of energetic inert gas ions and energetic oxygen ions throughout their deposition. Further, when a plurality of dielectric layer is applied, the thickness of each layer of the plurality of layers is in the range of 20-150 nm.

As has been mentioned previously, the dielectric coating materials can be any dielectric materials known in the art; the preferred materials being $SiO_2$, $Al_2O_3$ and $F-SiO_2$. When the dielectric material is $F-SiO_2$, the fluorine content of the material is in the range of 0.05 to 5 wt. %; preferably, 0.05 to 2 wt. %. The thickness of the deposited coating material is in the range of 20-120 μm, generally in the range of 30-80 nm. Layer thicknesses, and sequence of layers in the design, are selected by the designer to fit the particular application and wavelength. Layers may be multiples of quarter wave optical thickness, where the optical thickness is defined as the optical index of refraction multiplied by the physical thickness of a layer, but this is not a necessity. The layer next to aluminum is generally adjusted in thickness to account for the phase change upon reflection from the aluminum film. These design methods are explained in the references, and are well known to thin film designers.

The substrate can be any substrate suitable for making lithographic elements, particularly reflective or partially reflective lithographic elements. Examples of such substrate materials include silicon, aluminum, silica (glass), and glass-ceramic and ceramic materials. Preferably, the substrate materials have a low coefficient of thermal expansion, one less than $1.5 \times 10^{-6°}$ C./cm.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

I claim:

1. An extended lifetime element for use in high power excimer lasers, said element comprising:
    a substrate;
    an aluminum film deposited on the surface of the substrate, wherein the aluminum film is not oxidized; and
    one or a plurality of protective dielectric material layers applied to the surface of said aluminum film, each of said one or plurality of layers having a thickness in the range of 20- 150 nm;
    wherein the thickness of the one layer or the first of a plurality of dielectric layers comprises:
    a first sub-layer of thickness 4-8 nm densified by bombardment of energetic inert gas, not including oxygen, ions on top of the aluminum film and
    a second sub-layer of thickness 12-146 nm densified by bombardment of energetic inert-gas-and-oxygen ions on top of the first sub-layer, and
    wherein the sum of the total thickness of the first densified sub-layer and the second densified sub-layer is in the range of 20-150 nm.

2. The element according to claim 1, wherein the dielectric material is selected from the group consisting of $SiO_2$ and $F-SiO_2$.

3. The element according to claim 1, wherein the dielectric material is $F-SiO_2$.

4. The element according to claim 1, wherein said element is selected from the group consisting of a grating and a mirror, each of which can be reflective or partially reflective.

5. The method according to claim 1, wherein the substrate is selected from the group consisting of glass, glass-ceramics, ceramics, silicon and aluminum.

6. The element according to claim 1, wherein the substrate is glass and the element further comprises a bonding material between said glass and said aluminum layer, said bonding material being selected from the group consisting of nickel, chrome and nickel chrome alloys that bond to both glass and aluminum.

7. An element for use in a lithography laser system, said element being a reflective or partially reflective grating or mirror comprising:
    a glass, glass-ceramic or ceramic substrate;
    an aluminum film deposited on the surface of the substrate, wherein the aluminum film is not oxidized;
    a bonding layer between the substrate and the aluminum layer, the bonding layer comprising a bonding material selected from the group consisting of nickel, chrome and nickel-chrome alloys that-bond to the foregoing substrates and aluminum; and
    one or a plurality of protective dielectric material layers applied to the surface of said aluminum film, each of said one or plurality of layers having a thickness in the range of 20-150 nm;
    wherein the thickness of the one layer or the first of a plurality of dielectric layers comprises:
    a first sub-layer of thickness 4-8 nm densified by bombardment of energetic inert gas, not including oxygen, ions on top of the aluminum film and
    a second sub-layer of thickness 12-146 nm densified by bombardment of energetic inert-gas-and-oxygen ions on top of the first sub-layer, and
    wherein the sum of the total thickness of the first densified sub-layer and the second densified sub-layer is in the range of 20-150 nm; and
    wherein said one dielectric layer or said first dielectric layer of the plurality of layers is $F-SiO_2$.

8. The element for use in a lithography laser system according to claim 7, wherein the substrate is glass having an aluminum layer deposited thereon, and a bonding layer between said glass and said aluminum layer, said bonding layer being selected from the group consisting of nickel, chrome and nickel-chrome alloys bond to both glass and aluminum.

9. The element according to claim 1, wherein the energetic inert gas and inert-gas-and-oxygen ions that densify the first and the second sub-layers, respectively, of the one layer or first of a plurality of layers have an energy in the range of 80-150 eV.

10. The element according to claim 1, wherein the energetic inert gas and inert-gas-and-oxygen ions that densify the first and the second sub-layers, respectively, of the one layer or first of a plurality of layers have an energy of approximately 110 eV.

11. The element according to claim 7, wherein the energetic inert gas and inert-gas-and-oxygen ions that densify the first and the second sub-layers, respectively, of the one layer or first of a plurality of layers have an energy in the range of 80-150 eV.

12. The element according to claim 7, wherein the energetic inert gas and inert-gas-and-oxygen ions that densify the first and the second sub-layers, respectively, of the one layer or first of a plurality of layers have an energy in the range of approximately 110 eV.

13. The element according to claim 1, wherein when a plurality of dielectric layers are applied, the second and subsequent layers of the plurality of layers are densified by bombardment of energetic inert-gas-and-oxygen ions that have an energy in the range of 80-150 eV.

14. The element according to claim 1, wherein when a plurality of dielectric layers are applied, the second and subsequent layers of the plurality of layers are densified by bombardment of energetic inert-gas-and-oxygen ions that have an energy of approximately 110 eV.

15. The element according to claim 7, wherein when a plurality of dielectric layers are applied, the second and subsequent layers of the plurality of layers are densified by bombardment of energetic inert-gas-and-oxygen ions that have an energy in the range of 80-150 eV.

16. The element according to claim 1, wherein when a plurality of dielectric layers are applied, the second and subsequent layers of the plurality of layers are densified by bombardment of energetic inert-gas-and-oxygen ions that have an energy of approximately 110 eV.

* * * * *